US011450573B2

(12) United States Patent
Mulfinger et al.

(10) Patent No.: US 11,450,573 B2
(45) Date of Patent: Sep. 20, 2022

(54) STRUCTURE WITH DIFFERENT STRESS-INDUCING ISOLATION DIELECTRICS FOR DIFFERENT POLARITY FETS

(71) Applicant: GLOBALFOUNDRIES U.S. Inc., Santa Clara, CA (US)

(72) Inventors: George R. Mulfinger, Gansevoort, NY (US); Chung F. Tan, Ballston Spa, NY (US); Ryan W. Sporer, Mechanicville, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 16/903,559

(22) Filed: Jun. 17, 2020

(65) Prior Publication Data
US 2021/0398862 A1    Dec. 23, 2021

(51) Int. Cl.
| H01L 21/8238 | (2006.01) |
| H01L 27/092 | (2006.01) |
| H01L 21/762 | (2006.01) |
| H01L 29/06 | (2006.01) |
| H01L 27/12 | (2006.01) |
| H01L 21/02 | (2006.01) |

(52) U.S. Cl.
CPC ........ *H01L 21/823878* (2013.01); *H01L 21/76224* (2013.01); *H01L 21/76283* (2013.01); *H01L 21/823807* (2013.01); *H01L 27/092* (2013.01); *H01L 27/1203* (2013.01); *H01L 29/0649* (2013.01); *H01L 21/02274* (2013.01)

(58) Field of Classification Search
CPC ....... H01L 21/823878; H01L 21/76283; H01L 21/76224; H01L 29/7843; H01L 29/7846; H01L 29/7842; H01L 29/0649; H01L 29/0642; H01L 27/092; H01L 27/1203
See application file for complete search history.

(56) References Cited

U.S. PATENT DOCUMENTS

| 6,090,714 A * | 7/2000 | Jang ............... H01L 21/31055 438/692 |
| 7,262,472 B2 * | 8/2007 | Pidin ............... H01L 21/823814 257/E21.431 |
| 7,309,637 B2 * | 12/2007 | Lee ................. H01L 21/823807 257/E21.415 |
| 7,622,162 B1 | 11/2009 | van Schravendijk et al. |
| 7,767,515 B2 | 8/2010 | Moroz et al. |
| 3,021,956 A1 | 9/2011 | Ren et al. |
| 9,570,465 B2 | 2/2017 | Vinet et al. |
| 10,056,382 B2 * | 8/2018 | Guo ................ H01L 21/823807 |

(Continued)

*Primary Examiner* — Michael M Trinh
(74) *Attorney, Agent, or Firm* — Anthony Canale; Hoffman Warnick LLC (57) ABSTRACT

A structure and method use different stress-inducing isolation dielectrics to induce appropriate stresses in different polarity FETs to improve performance of both type FETs. The structure may include a first stress-inducing isolation dielectric surrounding and contacting a first active region for a p-type field effect transistor (PFET), and a second stress-inducing isolation dielectric surrounding and contacting a second active region for an n-type field effect transistor (NFET). The first and second stress-inducing isolation dielectrics induce different types of stress, thus improving performance of both polarity of FETs.

18 Claims, 5 Drawing Sheets

(56) References Cited

U.S. PATENT DOCUMENTS

| | | |
|---|---|---|
| 10,522,679 B2 | 12/2019 | Jha et al. |
| 2009/0321840 A1* | 12/2009 | Pidin ................... H01L 23/3192 |
| | | 257/E21.546 |
| 2010/0123197 A1* | 5/2010 | Jin ................... H01L 21/823878 |
| | | 257/369 |
| 2013/0175661 A1* | 7/2013 | Cai ........................ H01L 21/84 |
| | | 257/E29.02 |
| 2013/0307077 A1* | 11/2013 | Zhu ................... H01L 21/31053 |
| | | 257/350 |

* cited by examiner

STRUCTURE WITH DIFFERENT STRESS-INDUCING ISOLATION DIELECTRICS FOR DIFFERENT POLARITY FETS

BACKGROUND

The present disclosure relates to stressing of field effect transistors (FETs), and more specifically, to a structure and method employing different stress-inducing isolation dielectrics to impart distinct stresses to improve performance in both polarity FETs.

Advanced manufacturing of integrated circuits (ICs) requires formation of individual circuit elements, e.g., transistors such as FETs and the like, based on specific circuit designs. A FET generally includes source, drain, and gate regions. The gate region is placed between the source and drain regions and controls the current through a channel (or active region) between the source and drain regions.

The application of stresses to FETs is known to improve their performance. When applied in a longitudinal direction (i.e., in the direction of current flow), tensile stress is known to enhance electron mobility (or n-channel FET (NFET) drive currents) while compressive stress is known to enhance hole mobility (or p-channel FET (PFET) drive currents). Similarly, when applied in a lateral direction (i.e., perpendicular to the direction of current flow), compressive stress is known to enhance electron mobility (or n-channel FET (NFET) drive currents) while tensile stress is known to enhance hole mobility (or p-channel FET (PFET) drive currents). One way to apply such stresses in a longitudinal direction to a FET is the use of intrinsically-stressed barrier silicon nitride liners over the FETs, i.e., gates thereof. For example, a tensile-stressed silicon nitride liner may be used to cause tension in an NFET channel while a compressively-stressed silicon nitride liner may be used to cause compression in a PFET channel. Accordingly, a dual/hybrid liner scheme is required to induce the desired stresses in an adjacent NFET and PFET. Formation of dual/hybrid liner schemes can be challenging, resulting in yield issues during manufacture.

Trench isolations isolate different FETs in an IC. Generally, a trench is etched into a substrate surrounding all of the active regions and the trench is filled with an isolation dielectric to isolate one region of the substrate from an adjacent region of the substrate. One or more FETs of a given polarity may be disposed within an area isolated by the trench isolation. Certain isolation dielectrics can also induce stress in active regions of FETs. Conventionally, a single type of isolation dielectric surrounds the active regions of both the NFETs and PFETs, thus inducing a stress that only improves the performance of either the NFETs or PFETs, but not both.

SUMMARY

An aspect of the disclosure is directed to a structure, having: a first stress-inducing isolation dielectric surrounding and contacting a first active region for a p-type field effect transistor (PFET); and a second stress-inducing isolation dielectric surrounding and contacting a second active region for an n-type field effect transistor (NFET), wherein the first and second stress-inducing isolation dielectrics induce different types of stress.

Another aspect of the disclosure includes a trench isolation structure for a p-type field effect transistor (PFET) and an adjacent n-type field effect transistor (NFET), the trench isolation structure comprising: a trench opening defined in a substrate, a first portion of the trench opening spacing a first active region of the PFET from a second active region of the NFET; a first stress-inducing isolation dielectric in the trench opening and surrounding the first active region for the PFET; and a second stress-inducing isolation dielectric in the trench opening and surrounding the second active region for the NFET, wherein the first and second stress-inducing isolation dielectrics induce different stresses and abut one another in the first portion of the trench opening between the first and second active regions.

Another aspect of the disclosure relates to a method, including: forming a trench isolation in a substrate surrounding a first active region for a first polarity field effect transistor (FET) and surrounding a second active region for a second, different polarity field effect transistor (FET), the trench isolation including a first stress-inducing isolation dielectric therein; and removing the first stress-inducing isolation dielectric from a portion of the trench isolation surrounding the second active region of the second polarity FET, and forming a second stress-inducing isolation dielectric in the portion of the trench isolation surrounding the second active region for the second polarity FET, wherein the first and second stress-inducing isolation dielectrics induce different types of stress, and wherein, in a space between the first and second active regions, an upper surface of the first stress-inducing isolation dielectric is non-coplanar with an upper surface of the second stress-inducing isolation dielectric.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This textual arrangement may be extended, as readily apparent by one of ordinary skill in the art, for as many items listed.

Embodiments of the disclosure provide a structure and method employing different stress-inducing isolation dielectrics to induce distinct stresses in different polarity FETs to improve performance of both types of FETs. The structure includes different stress-inducing isolation dielectrics surrounding and contacting active regions of FETs to improve performance thereof, e.g., by inducing lattice deformation that improves current flow. The stress-inducing "isolation dielectrics" are so named because they are located in trench isolations surrounding the active regions, e.g., shallow and/or deep trench isolations, that also electrically isolate the active regions. A first stress-inducing isolation dielectric surrounds and contacts a first active region for a p-type field effect transistor (PFET), and a second stress-inducing isolation dielectric surrounds and contacts a second active region for an n-type field effect transistor (NFET). The first and second stress-inducing isolation dielectrics induce different types of stress, depending on the polarity of the FET, thus improving performance of both polarity of FETs.

Figure 1:
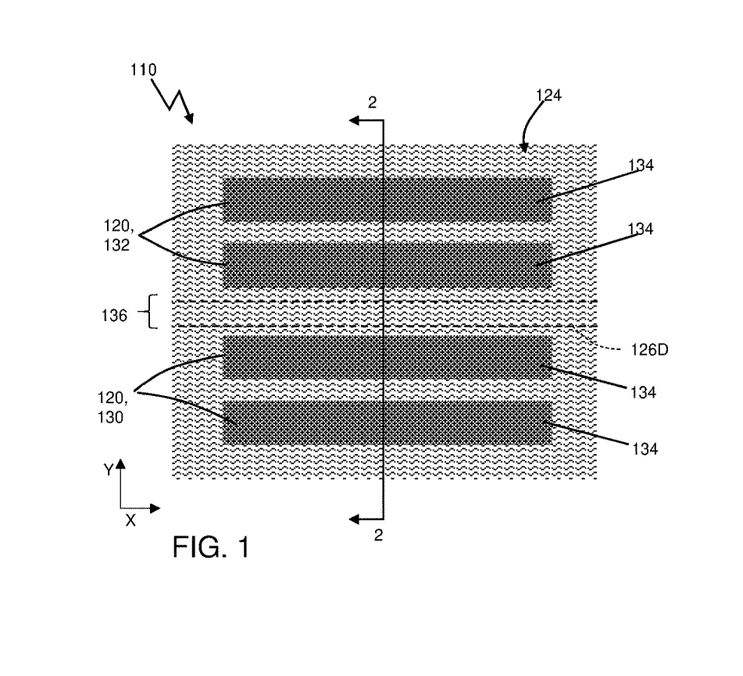
FIG. 1 shows a plan view of a preliminary structure, according to embodiments of the disclosure.
Figure 2:
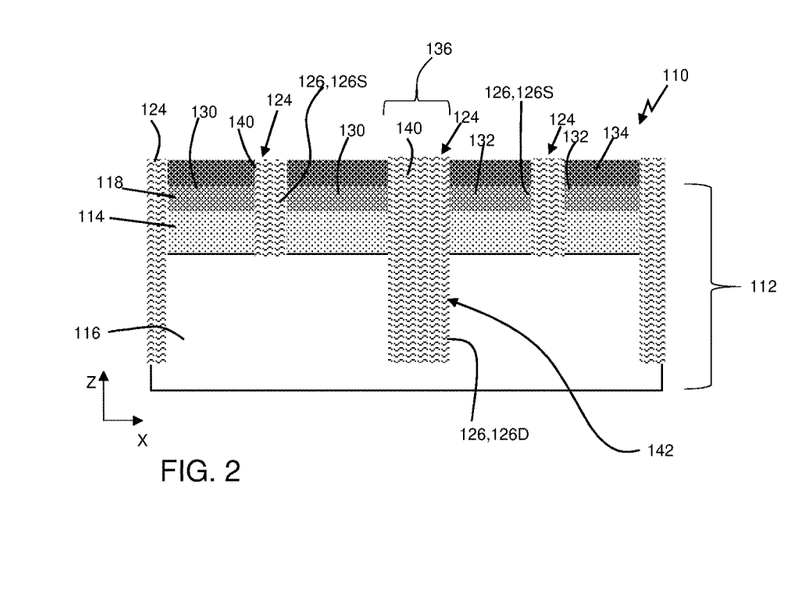
FIG. 2 shows a cross-sectional view of the preliminary structure along line 2-2 in FIG. 1 and forming an isolation dielectric in a trench opening, according to embodiments of the disclosure.

FIGS. 1-7 show various views of a method for forming a trench isolation structure 100 (FIGS. 6 and 7) according to embodiments of the disclosure. FIG. 1 shows a plan view of a preliminary structure 110, and FIG. 2 shows a cross-sectional view along line 2-2 in FIG. 1. FIGS. 1 and 2 show processing after a number of preliminary steps. At this stage, preliminary structure 110 includes a substrate 112. Substrate 112 may take a variety of forms, but in one non-limiting example may include a fully depleted semiconductor-on-insulator (FDSOI) substrate. FDSOI is a process technology that uses an ultra-thin layer of insulator, called buried insulator layer 114 or buried oxide (BOX), positioned on top of a base semiconductor substrate 116, and a very thin semiconductor layer 118 over buried insulator 114 layer that provides the transistor channel(s). Semiconductor layer 118 may be referred to as an SOI layer (hereinafter "SOI layer 118"). SOI layer 118 does not need to be doped to create the channel, thus making the transistor "fully depleted." FDSOI provides better transistor electrostatic characteristics compared to bulk semiconductor technology. Buried insulator layer 114 lowers the parasitic capacitance between the drain and source, and confines the electrons flowing from the source to the drain, reducing leakage currents that damage performance. Substrate 112 may be formed using any now known or later developed semiconductor fabrications techniques. SOI layer 118 may be formed into a plurality of active regions 120 (FIG. 1 only) in any now known or later developed fashion.

Base semiconductor substrate 116 and SOI layer 118 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Although not necessary in all instances, in certain embodiments, SOI layer 118 may include greater than 20% germanium (Ge) by weight.

FIGS. 2-7 show forming a trench isolation 124 in substrate 112 surrounding a first active region 130 for a first polarity field effect transistor (FET) and surrounding a second active region 132 for a second, different polarity FET. (It is noted that structure referred to a "trench isolation 124" will vary during the processing, but eventually will result in trench isolation structure 100 (FIGS. 6-7)). Trench openings 126 of trench isolation 124 may be formed using any now known or later developed processes. As will be described herein, trench opening 126 may include a number of portions. Conventionally, trench opening(s) 126 is/are etched into substrate 112 and filled with a single isolation dielectric to isolate a first active region 130 (two active SOI regions shown) of substrate 112 from an adjacent, second active region 132 (two active SOI regions shown) of substrate 112. It is appreciated that the different active regions 130, 132 will eventually be used for different polarity FETs, i.e., PFETs and NFETs, and more particularly, where SOI layer 118 provides semiconductor active regions 120, SOI layer 118 creates FDSOI pFETs and nFETs. As will be described, in accordance with embodiments of the disclosure, trench isolation 124 eventually includes a number of different stress-inducing isolation dielectrics.

As shown in FIGS. 1 and 2, both active regions 130, 132 are in SOI layer 118, and are formed by a shallow trench isolation process (FIG. 2). Although two sections are shown for each active region 130, 132, any number may be used, e.g., more or less than two. Active regions 130, 132 may be configured to create different polarity FETs. For example, first active region 130 may be doped to form an n-type SOI active region, and second active region 132 may be doped to form a p-type SOI active region. It will be readily recognized that the polarities may be switched, if desired, with first active region 130 doped to form a p-type SOI active region, and second active region 132 doped to form an n-type SOI active region. In any event, one or more transistors of a given polarity may be disposed within an area isolated by trench isolation 124. A cap 134 may be formed to protect the various active regions 130, 132 during subsequent processing. Cap 134 may include any now known or later developed cap material such as but not limited to silicon nitride.

Trench openings 126 may be formed to one depth, i.e., all as shallow trench isolations. Alternatively, as illustrated in FIG. 2, trench openings 126 may include different depth trench openings such as shallow trench openings 126S that extend into buried insulator layer 114, and deep trench opening(s) 126D that extends into base semiconductor substrate 116. Here, trench openings 126 may be formed at different times, or at the same time. For example, shallow trench openings 126S may be formed, e.g., using a mask (not shown) and etching to or into buried insulator layer 114. Another mask (not shown) may then be formed over all but space 136 between active regions 130, 132, and additional etching carried out into base semiconductor substrate 116 to form deep trench opening 126D, i.e., in a space 136 between active regions 130, 132.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases that approach the wafer approximately from one direction, and therefore this process is highly anisotropic. Reactive-ion etching (RIE) operates under conditions intermediate between sputter and plasma etching and may be used to produce deep, narrow features, such as STI trenches. Trench openings 126 may be etched, for example, using a RIE.

As shown in FIG. 2, where deep trench isolation(s) 126D are provided, trench opening 126 may be filled with an isolation dielectric 140 that is configured for high aspect ratio flow (e.g., >100 nm depth). That is, forming trench isolation 124 includes forming isolation dielectric 140 in trench opening 126, and notably, in deep trench opening 126D in space 136 between first and second active regions 130, 132 (prior to forming first and second stress-inducing isolation dielectrics 144, 150, as will be described herein). In this manner, a lower portion 142 of deep trench opening 126D can be filled. Isolation dielectric 140 may include any now known or later developed dielectric configured for high aspect ratio flow. In one non-limiting example, isolation dielectric 140 may include a flowable chemical vapor deposited (FCVD) silicon oxide, capable of filling lower portion 142 of deep trench opening 126D. Other possible dielectrics include high aspect ratio plasma oxide (HARP®, available from Applied Materials), atomic layer deposited (ALD) oxide, in-situ radical assisted deposited (iRAD) oxide (commercially available from Tokyo Electron Laboratory (TEL)), conformal oxides, or a spin on glass (SOG). Use of isolation dielectric 140 may be omitted where deep trench openings 126D are not employed. Any necessary planarization to cap 134 may be performed to remove any excess material.

Figure 3:
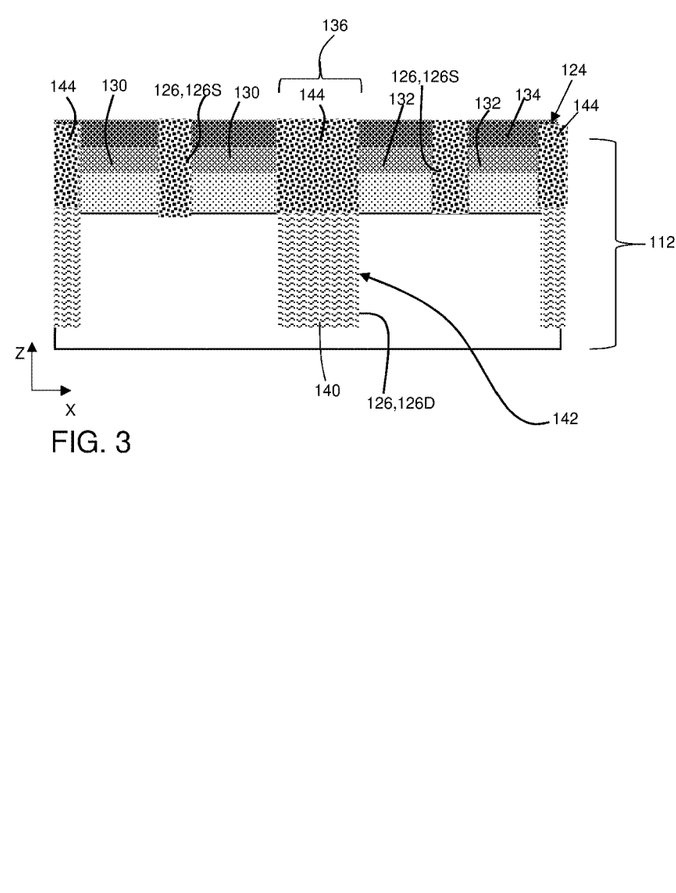
FIG. 3 shows a cross-sectional view of forming a first stress-inducing isolation dielectric, according to embodiments of the disclosure.
Figure 4:
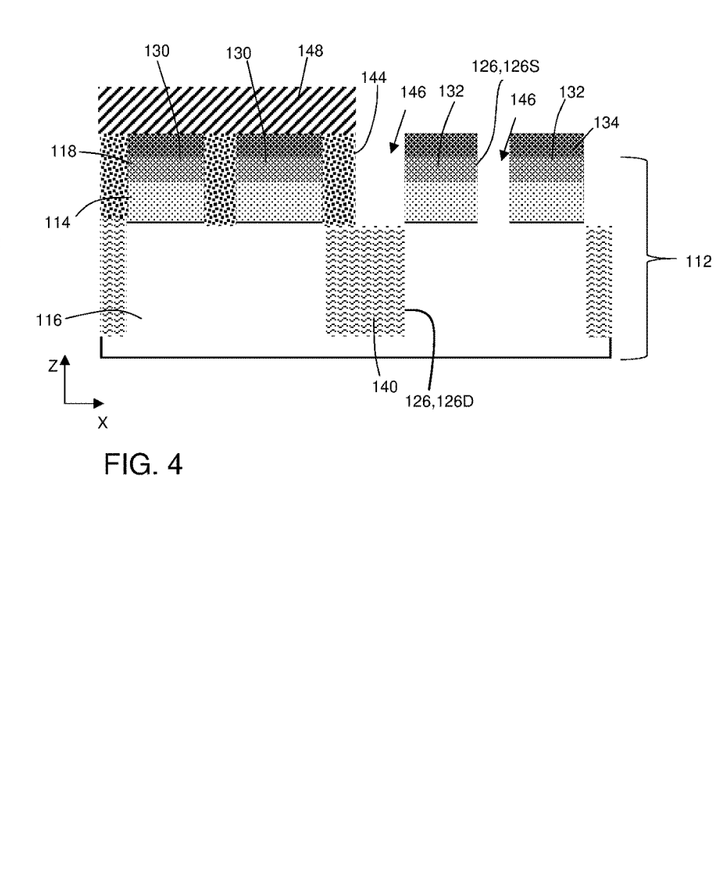
FIG. 4 shows a cross-sectional view of removing the first stress-inducing isolation dielectric from a selected active region, according to embodiments of the disclosure.

FIG. 3 shows a cross-sectional view of etching back isolation dielectric 140, where provided, e.g., using a mask and RIE, and forming trench isolation 124 in substrate 112 with a first stress-inducing isolation dielectric 144. Hence, trench isolation 124 includes first stress-inducing isolation dielectric 140 therein. As noted, trench isolation 124 and first stress-inducing isolation dielectric 144 therein surround first active region 130 for first polarity FET, and surround second active region 132 for second, different polarity FET. More particularly, first stress-inducing isolation dielectric 144 surrounds and contacts first active region 130 for first polarity FET(s), and surrounds and contacts second active region 132 for second, different polarity FET(s). There is no space between active regions 130, 132 and first stress-inducing isolation dielectric 144. First stress-inducing isolation dielectric 144 may be deposited using any appropriate deposition technique for the material selected. "Depositing" may include but is not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Any necessary planarization to cap 134 may be performed to remove any excess material. Cap 134 has a slower etch rate than the underlying first stress-inducing isolation dielectric 144 to avoid unwanted recessing during subsequent processing steps.

Conventionally, trench openings 126 is/are etched into substrate 112 and filled with a single isolation dielectric to isolate first active region 130 of substrate 112 from adjacent, second active region 132 of substrate 112. Hence, processing would normally stop at the stage shown in FIG. 3. In this case, stress-inducing isolation dielectric 144 imparts only one type of stress (i.e., compressive or tensile) to active regions 130, 132. The single type of stress may improve performance in one polarity of the FETs using one active region, but would negatively impact performance in the other polarity of FETs using the other active region. In contrast, in accordance with embodiments of the disclosure, as shown in the cross-sectional view of FIG. 4, first stress-inducing isolation dielectric 144 is removed from a portion 146 of trench isolation 124 surrounding second active region 132 for the second polarity FET. In this case, removal of first stress-inducing isolation dielectric 144 from second active region 132 is selected because performance of the FET that uses second active region 132 would not be improved by that isolation dielectric. First stress-inducing isolation dielectric 144 may be removed, for example, by patterning a mask 148, and etching to remove the dielectric, e.g., using a RIE. The depth of the etching may vary, but at least reaches the lower extent of shallow trench openings 126S, thus removing isolation dielectric 144 from around second active region 132. In the example shown, isolation dielectric 140 in lower portion 142 of deep trench opening 126D is also exposed. The etching may be any appropriate etching chemistry for first stress-inducing isolation dielectric 144.

Figure 5:
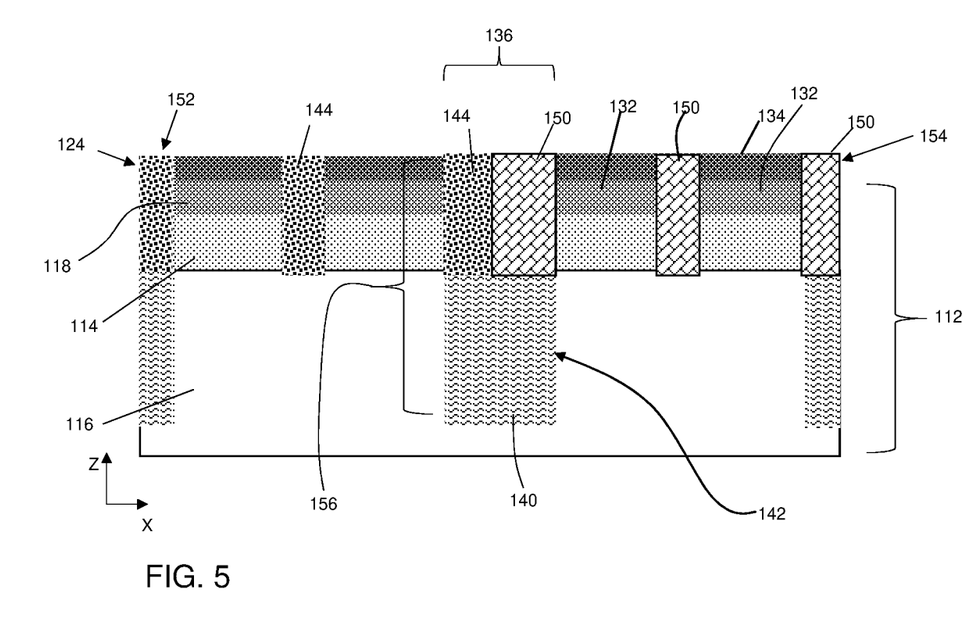
FIG. 5 shows a cross-sectional view of forming a second stress-inducing isolation dielectric over the selected active region that provides a different stress than the first stress-inducing isolation dielectric, according to embodiments of the disclosure.

FIG. 5 shows a cross-sectional view of forming a second stress-inducing isolation dielectric 150 in portion 146 (FIG. 4) of trench isolation 124 surrounding second active region 132 for the second polarity FET. More particularly, second stress-inducing isolation dielectric 150 in portion 146 of trench isolation 124 surrounds and contacts second active region 132 for the second polarity FET, i.e., with no material therebetween. Second stress-inducing isolation dielectric 150 may be deposited using any appropriate deposition technique for the material selected. Any necessary planarization to cap 134 may be performed to remove any excess material.

As illustrated in FIG. 5, first and second stress-inducing isolation dielectrics 144, 150 abut one another, i.e., contact one another, in space 136 between first and second active regions 130, 132. First stress-inducing isolation dielectric 144 forms a shallow trench isolation (STI) 152 surrounding first active region 130; second stress-inducing isolation dielectric 150 forms a STI 154 surrounding first active region 132; and first and second stress-inducing isolation dielectrics 144, 150 form an upper portion of a deep trench isolation (DTI) 156 formed with isolation dielectric 140 in space 136 between active regions 130, 132.

Figure 6:
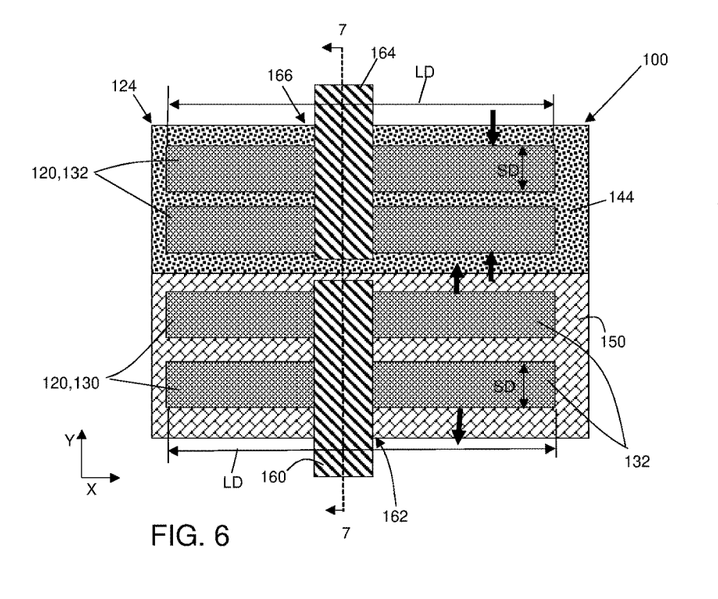
FIG. 6 shows a plan view of a trench isolation structure, according to embodiments of the disclosure.
Figure 7:
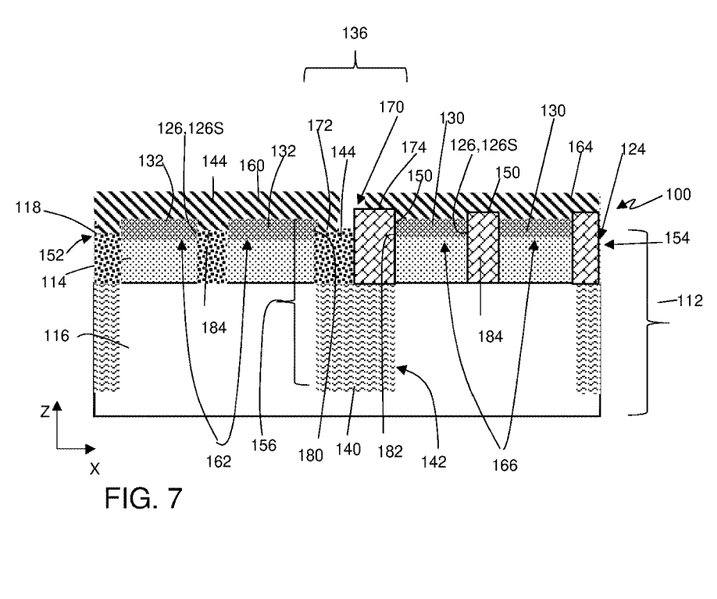
FIG. 7 shows a cross-sectional view of the trench isolation structure along line 7-7 in FIG. 6 and with gate structures thereon, according to embodiments of the disclosure.

First and second stress-inducing isolation dielectrics 144, 50 induce different types of stress. That is, one dielectric induces a compressive stress and the other dielectric induces a tensile stress. To illustrate, FIG. 6 shows a plan view and FIG. 7 shows a cross-sectional view of the structure with a gate structure 160 over first active region 130 forming a first polarity FET 162, and a gate structure 164 over second active region 132 forming a second, different polarity FET 166. As noted, each active region 130, 132 may include multiple active region sections (transistors) 120 (FIG. 1). Active region sections 120 (FIG. 1) (and other forms of active region 130, 132) may have a rectangular diffusion length (long dimension) LD (FIG. 6), and a smaller, diffusion width (short dimension) SD (FIG. 6). Gate structures 160, 164 are positioned perpendicularly over diffusion length LD and between source/drain regions (not labeled) in active regions 130, 132. Consequently, a direction of current flow is along diffusion length LD of active regions 130, 132 (left-to-right or vice versa, on page of FIG. 6). When applied in a lateral direction, i.e., across a diffusion width of an active region 130, 132 (up and down in FIG. 6), a compressive stress is known to enhance electron mobility (or n-channel FET (NFET) drive currents), while tensile stress is known to enhance hole mobility (or p-channel FET (PFET) drive currents). For example, where first active region 130 is a p-type SOI, first stress-inducing isolation dielectric 144 may impart a tensile stress across diffusion width (SD) of first active region 130 of the PFET 162. Where long, narrow active semiconductor regions are used, first stress-inducing isolation dielectric 144 imparts a tensile stress (see arrows in FIG. 6) across a width of each semiconductor active region section 120 (FIG. 6) of first active region 130 of PFET 162, i.e., FDSOI PFET. In contrast, second stress-inducing isolation dielectric 150 may impart a compressive stress (see arrows in FIG. 6) across diffusion width (SD) of sections 120 of second active region 132 of NFET 166. Second stress-inducing isolation dielectric 150 imparts a compressive stress across a diffusion width of each semiconductor active region section 120 (FIG. 6) of second active region 132 of NFET 166, i.e., FDSOI NFET.

First stress-inducing isolation dielectric 144 may include any now known or later developed dielectric that creates a compressive or tensile stress that improves performance in one or the other of the FETs formed using active region 130 or 132. In certain embodiments, first stress-inducing isolation dielectric 144 may include a semi-atmosphere chemical vapor deposition (SACVD) tetraethyl orthosilicate (Si(OC$_2$H$_5$)$_4$)(TEOS) based oxide (e.g., high-aspect-ratio process (HARP)® oxide available from Applied Materials®). SACVD TEOS-based oxide imparts a tensile stress. Alternatively, first stress-inducing isolation dielectric 144 may include a high-density plasma chemical vapor deposition (HDP-CVD) oxide, which imparts a compressive stress. Second stress-inducing isolation dielectric 150 may include the other of the SACVD TEOS-based oxide and HDP-CVD oxide, to impart the opposite stress. Other examples of stress-inducing isolation dielectrics that are compressive include but are not limited to silicon nitride films, and combinations of certain silicon nitride and oxide films; and other examples of stress-inducing isolation dielectrics that are tensile include but are not limited to silicon nitride films, and combinations of certain silicon nitride and oxide films. While the disclosure has been described with an illustrative tensile stress-inducing isolation dielectric 144 being formed first, partially removed, and then a compressive stress-inducing isolation dielectric 150 being formed, it will be recognized that the order of the formation can be readily switched within the teachings of the disclosure. It is noted that the stated stresses are present after final formation of the dielectrics, and some dielectrics may change from one stress to another during processing, e.g., SACVD TEOS-based oxide may be tensile when deposited, but become compressive after an anneal.

First and second stress-inducing isolation dielectrics 144, 150 may have different hardnesses or etch rates. For example, HDP-CVD oxide is a harder material than SACVD TEOS-based oxide. Consequently, as shown in FIG. 7, the planarization of the latter formed material may result in a step 170 being formed. That is, in space 136 between first and second active regions 130, 132, an upper surface 170 of first stress-inducing isolation dielectric 144 may be non-coplanar with an upper surface 174 of second stress-inducing isolation dielectric 150. In the example shown, first stress-inducing isolation dielectric 144 is softer, and hence, has the lower upper surface 172.

FIGS. 6 and 7 also show trench isolation structure 100 for PFET 162 and an adjacent NFET 166, according to embodiments of the disclosure. Structure 100 includes first stress-inducing isolation dielectric 144 surrounding and contacting first active region 130 for PFET 162, and second stress-inducing isolation dielectric 150 surrounding and contacting second active region 132 for NFET 166. As stated, first and second stress-inducing isolation dielectrics 144, 150 induce different types of stress, i.e., tensile (in Y-direction) for PFET and compressive (in Y-direction) for NFET. In one non-limiting example, first stress-inducing isolation dielectric 144 may include SACVD TEOS-based oxide or HDP-CVD oxide, and second stress-inducing isolation dielectric 150 may include the other of the SACVD TEOS-based oxide and the HDP-CVD oxide.

As shown in FIG. 7, first active region 130 of PFET 162 and second active region 132 of NFET 166 are immediately adjacent one another. Trench isolation structure 100 may also include trench opening 126. Trench opening 126 includes a first portion, i.e., deep trench opening 126D, defined in substrate 112 that spaces first active region 130 of PFET 162 from second active region 132 of NFET 166. Deep trench opening 126D is defined in space 136 between a first side 180, 182 of each first and second active regions 130, 132, respectively. Deep trench opening 126D (first portion of trench opening 126) includes both first stress-inducing isolation dielectric 144 and second stress-inducing isolation dielectric 150 therein. First and second stress-inducing isolation dielectrics 144, 150 induce different stresses and abut one another in trench opening 126D between first and second active regions 130, 132. Deep trench opening 126D (first portion of trench opening 126) may also include another isolation dielectric 140 below both first and second stress-inducing isolation dielectrics 144, 150 in the deep trench opening. Collectively, these isolation dielectrics 140, 144, 150 in space 136 create DTI 156. In space 136 between first sides 180, upper surface 172 of first stress-inducing isolation dielectric 144 dielectric is non-coplanar with upper surface 174 of second stress-inducing isolation dielectric 150, e.g., due to the materials' different hardnesses and/or etch rates.

Shallow trench opening(s) 126S are defined in a space to a second, opposing side 184 of each first and second active regions 130, 132 (and surround any other active regions to the side thereof). Each shallow trench opening 126S includes first stress-inducing isolation dielectric 144 or second stress-inducing isolation dielectric 150, depending on the type of stress that will improve performance of the surrounded active region. In this manner, trench opening 126 of trench isolation structure 100 also includes a second portion, i.e., shallow trench opening 126S, contiguous with first portion, i.e., deep trench opening 126D, and extending to surround first active region 130 of PFET 162. Shallow trench opening 126S about first active region 130 includes first stress-inducing isolation dielectric 144 therein, creating STI 152. Trench opening 126 of trench isolation structure 100 may also include a third portion, i.e., shallow trench opening 126S, contiguous with first portion, i.e., deep trench opening 126D, and extending to surround second active region 132 of NFET 166. Shallow trench opening 126S about second active region 132 includes second stress-inducing isolation dielectric 150 therein, creating STI 154. As noted, in certain embodiments, first and second active regions 130, 132 are created in an FDSOI substrate 112. In this case, deep trench opening 126D extends into (base semiconductor) substrate 116 of FDSOI substrate 112 and shallow trench opening(s) 126S extend to or into buried insulator layer 114 of FDSOI substrate 112. First portion 126D of trench opening 126 is deeper in substrate 112 than each of second and third portions 126S. In certain embodiments, base semiconductor substrate 116 and SOI layer 118 of FDSOI substrate 112 may include at least 20% germanium (Ge) by weight.

Figure 8:
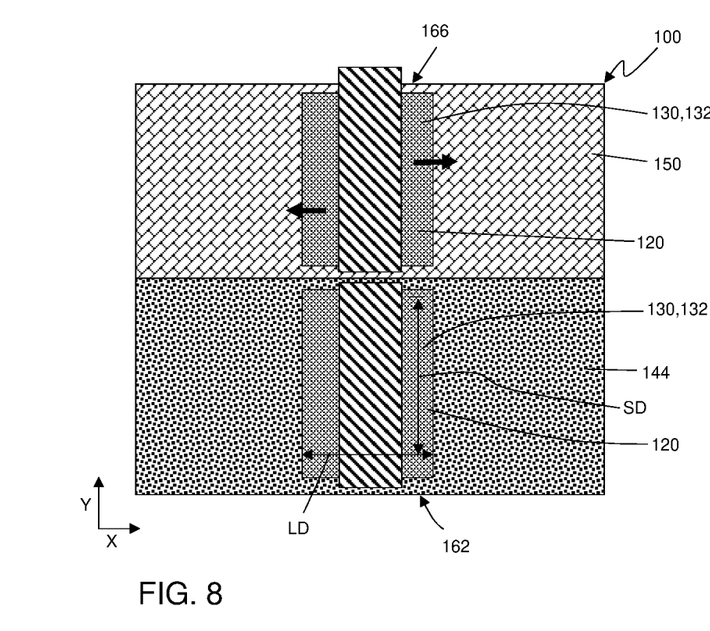
FIG. 8 shows an enlarged plan view of a trench isolation structure about an active region, according to an alternative embodiment of the disclosure.

FIG. 8 shows an enlarged plan view of trench isolation structure 100 about an active region 130 or 132, according to an alternative embodiment of the disclosure. Generally, as described herein, tensile stress improves performance of a PFET 162 (FIG. 6), and compressive stress improves performance for an NFET 166 (FIG. 6). Accordingly, per the example above, first stress-inducing isolation dielectric 144 may include SACVD TEOS-based oxide to impart a tensile stress to diffusion width SD of first active region 130 for PFET 162 (FIG. 6). A second stress-inducing isolation dielectric 150 may include HDP-CVD oxide to impart a compressive stress to diffusion width SD of second active region 132 for NFET 166 (FIG. 6). However, it is emphasized that tensile stress can also be used to improve the performance of NFETs or PFETs depending on the dimensions, shape and/or layout of the active region, and where the stress is applied. Similarly, compressive stress can be used to improve the performance of NFETs or PFETs depending on the dimensions, shape and/or layout of the active region, and where the stress is applied. For example, as shown in FIG. 8, active regions 130, 132 may be laid out vertically across the page, such that a diffusion length (LD) is shorter than a diffusion width (SD). An active region or portion thereof may take this form for a number of reasons such as but not limited to a diffusion break (not shown) being present in, for example, a section of active region 120. In this case where diffusion length LD is less than diffusion width SD, the stress that is beneficial to improve performance of a FET may be different than that applied to the other portions of active region 130, 132, as illustrated in FIG. 6. In this case, trench isolation structure 100 may include a tensile (in X-direction) stress-inducing isolation dielectric 150 surrounding and contacting an active region for NFET 166 and a compressive (in X-direction) stress-inducing isolation dielectric 144 surrounding and contacting an active region for PFET 162.

Embodiments of the disclosure provide a structure and method employing different stress-inducing isolation dielectrics to induce distinct stresses in different polarity FETs to improve performance of both type FETs. The first and second stress-inducing isolation dielectrics provide the ability to improve both PFET and NFET strain with just one additional mask layer versus two masks typically provided for a dual/hybrid stress liner scheme. Hence, the disclosure reduces the risk of yield issues from the dual/hybrid stress liner scheme, e.g., tungsten-subways in middle-of-line processing. Embodiments of the disclosure can replace dual/hybrid stress liners, or be used in addition to dual/hybrid stress liners.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
a first stress-inducing isolation dielectric surrounding a first active region for a p-type field effect transistor (PFET);
a second stress-inducing isolation dielectric surrounding a second active region for an n-type field effect transistor (NFET);
a deep trench opening defined in a space between a first side of each the first and second active regions, the deep trench opening including both the first stress-inducing isolation dielectric and the second stress-inducing isolation dielectric therewithin; and
a gate structure, wherein a lower surface of the gate structure abuts an upper surface of the first stress-inducing isolation dielectric,
wherein the upper surface of the first stress-inducing isolation dielectric is non-coplanar with an upper surface of the second stress-inducing isolation dielectric, and
wherein the first and second stress-inducing isolation dielectrics induce different types of stress.

2. The structure of claim 1, wherein the first active region of the PFET and the second active region of the NFET are immediately adjacent one another.

3. The structure of claim 1, further comprising a third isolation dielectric below both the first and second stress-inducing isolation dielectrics in the deep trench opening.

4. The structure of claim 1, further comprising a shallow trench opening defined in a space to a second, opposing side of each the first and second active regions, each shallow trench opening including one of the first stress-inducing isolation dielectric and the second stress-inducing isolation dielectric.

5. The structure of claim 4, wherein the first and second active regions are part of a fully-depleted semiconductor-on-insulator (FDSOI) substrate, wherein the deep trench opening extends into a substrate layer of the FDSOI substrate and the shallow trench opening extends into a buried insulator layer of the FDSOI substrate.

6. The structure of claim 1, wherein each active region has a diffusion length and a smaller diffusion width, and wherein the first stress-inducing isolation dielectric imparts a tensile stress across the diffusion width of the first active region of the PFET and the second stress-inducing isolation dielectric imparts a compressive stress across the diffusion width of the second active region of the NFET.

7. The structure of claim 1, the first stress-inducing isolation dielectric imparts a tensile stress across a width of the first active region of the PFET and the second stress-inducing isolation dielectric imparts a compressive stress across a width of the second active region of the NFET.

8. The structure of claim 1, wherein the first stress-inducing isolation dielectric includes one of a semi-atmosphere chemical vapor deposition tetraethyl orthosilicate (SACVD TEOS) based oxide, and a high-density plasma chemical vapor deposition (HDP-CVD) oxide, and the second stress-inducing isolation dielectric includes the other of the SACVD TEOS-based oxide and the HDP-CVD oxide.

9. A structure, comprising:
a trench isolation structure for a p-type field effect transistor (PFET) and an adjacent n-type field effect transistor (NFET), the trench isolation structure comprising:
a trench opening defined in a substrate, a first portion of the trench opening spacing a first active region of the PFET from a second active region of the NFET;
a first stress-inducing isolation dielectric inside the trench opening and surrounding the first active region for the PFET; and
a second stress-inducing isolation dielectric inside the trench opening and surrounding the second active region for the NFET, and
a gate structure positioned over the trench isolation structure, wherein a lower surface of the gate structure abuts an upper surface of the first stress-inducing isolation dielectric,
wherein the upper surface of the first stress-inducing isolation dielectric is non-coplanar with an upper surface of the second stress-inducing isolation dielectric, and
wherein the first and second stress-inducing isolation dielectrics induce different stresses and abut one another in the first portion of the trench opening between the first and second active regions.

10. The structure of claim 9, further comprising a third isolation dielectric in a lower portion of the first portion of the trench opening under the first and second stress-inducing isolation dielectrics.

11. The structure of claim 10, wherein the trench opening further includes:
   a second portion contiguous with the first portion, the second portion extending to surround the first active region of the PFET and including the first stress-inducing isolation dielectric therein; and
   a third portion contiguous with the first portion, the third portion extending to surround the second active region of the NFET and including the second stress-inducing isolation dielectric therein,
   wherein the first portion is deeper in the substrate than each of the second and third portions.

12. The structure of claim 9, wherein each active region has a diffusion length and a smaller diffusion width, and wherein the first stress-inducing isolation dielectric imparts a tensile stress across the diffusion width of the first active region of the PFET and the second stress-inducing isolation dielectric imparts a compressive stress across the diffusion width of the second active region of the NFET.

13. The structure of claim 9, wherein the first stress-inducing isolation dielectric includes one of a semi-atmosphere chemical vapor deposition tetraethyl orthosilicate (SACVD TEOS) based oxide, and a high-density plasma chemical vapor deposition (HDP-CVD) oxide, and the second stress-inducing isolation dielectric includes the other of the SACVD TEOS-based oxide and the HDP-CVD oxide.

14. The structure of claim 9, further comprising a third isolation dielectric below both the first and second stress-inducing isolation dielectrics in the first trench opening.

15. A method, comprising:
   forming a trench isolation in a substrate surrounding a first active region for a first polarity field effect transistor (FET) and surrounding a second active region for a second, different polarity field effect transistor (FET), the trench isolation including a first stress-inducing isolation dielectric therewithin;
   removing a portion of the first stress-inducing isolation dielectric from a portion of the trench isolation surrounding the second active region of the second polarity FET;
   forming a second stress-inducing isolation dielectric in the portion of the trench isolation surrounding the second active region for the second polarity FET; and
   forming a gate structure positioned over the trench isolation, wherein a lower surface of the gate structure abuts an upper surface of the first stress-inducing isolation dielectric,
   wherein the first and second stress-inducing isolation dielectrics induce different types of stress, and
   wherein, in a space between the first and second active regions, an upper surface of the first stress-inducing isolation dielectric is non-coplanar with an upper surface of the second stress-inducing isolation dielectric.

16. The method of claim 15, wherein the first and second stress-inducing isolation dielectrics abut one another in the space between the first and second active regions.

17. The method of claim 15, wherein forming the trench isolation includes forming a third isolation dielectric in the space between the first and second active regions prior to forming the first and second stress-inducing isolation dielectrics.

18. The method of claim 14, wherein the first stress-inducing isolation dielectric includes one of a semi-atmosphere chemical vapor deposition tetraethyl orthosilicate (SACVD TEOS) based oxide, and a high-density plasma chemical vapor deposition (HDP-CVD) oxide, and the second stress-inducing isolation dielectric includes the other of the SACVD TEOS-based oxide and the HDP-CVD oxide.

* * * * *

UNITED STATES PATENT AND TRADEMARK OFFICE
CERTIFICATE OF CORRECTION

PATENT NO. : 11,450,573 B2
APPLICATION NO. : 16/903559
DATED : September 20, 2022
INVENTOR(S) : George R. Mulfinger et al.

It is certified that error appears in the above-identified patent and that said Letters Patent is hereby corrected as shown below:

On the Title Page

Under item (56), References Cited the sixth reference reads "3,021,956 A1 9/2011 Ren et al.", should read "8,021,956 B2 9/2011 Ren et al."

Signed and Sealed this
Fifteenth Day of November, 2022

Katherine Kelly Vidal
*Director of the United States Patent and Trademark Office*